(12) United States Patent
Yang et al.

(10) Patent No.: US 12,704,548 B2
(45) **Date of Patent: *Aug. 11, 2026**

(54) DELAY MEASUREMENT SYSTEM AND MEASUREMENT METHOD

(71) Applicant: TAIWAN SEMICONDUCTOR MANUFACTURING COMPANY LTD., Hsinchu (TW)

(72) Inventors: Shang Hsien Yang, Hsinchu City (TW); Chung-Chieh Yang, Hsinchu County (TW); Yung-Chow Peng, Hsinchu (TW); Chih-Chiang Chang, Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 95 days.

This patent is subject to a terminal disclaimer.

(21) Appl. No.: 18/937,072

(22) Filed: Nov. 5, 2024

(65) Prior Publication Data

US 2025/0060410 A1 Feb. 20, 2025

Related U.S. Application Data

(63) Continuation of application No. 17/671,999, filed on Feb. 15, 2022, now Pat. No. 12,169,222.

(51) Int. Cl.

| | |
|---|---|
| ***G01R 31/319*** | (2006.01) |
| ***G01R 31/317*** | (2006.01) |
| ***G01R 31/3183*** | (2006.01) |
| ***H03K 3/037*** | (2006.01) |
| ***H03K 5/26*** | (2006.01) |

(52) U.S. Cl.
CPC . *G01R 31/31922* (2013.01); *G01R 31/31725* (2013.01); *G01R 31/318328* (2013.01); *G01R 31/3191* (2013.01); *H03K 3/037* (2013.01); *H03K 5/26* (2013.01)

(58) Field of Classification Search
CPC ........ G01R 31/31922; G01R 31/31725; G01R 31/318328; G01R 31/3191; H03K 3/037; H03K 5/26
See application file for complete search history.

(56) References Cited

U.S. PATENT DOCUMENTS

2003/0126530 A1* 7/2003 Larson ............ G01R 31/31922 714/724

* cited by examiner

*Primary Examiner* — Mark D Featherstone
*Assistant Examiner* — Rong Tang
(74) *Attorney, Agent, or Firm* — WPAT LAW; Anthony King

(57) ABSTRACT

A delay measurement system and a measurement method are provided. The delay measurement system includes a delay control device and a comparator. The delay control device is configured to generate a second signal in response to a first signal, wherein a rising edge of the second signal delays a first delay time with respect to a rising edge of the first signal, and the first delay time is controlled in response to an output signal of a comparator. The comparator is configured to compare the first delay time with a second delay time and output the output signal, wherein a rising edge of a third signal delays the second delay time with respect to the rising edge of the first signal, and the third signal is generated by a device under test (DUT) in response to the first signal.

20 Claims, 16 Drawing Sheets

DELAY MEASUREMENT SYSTEM AND MEASUREMENT METHOD

CROSS REFERENCE TO RELATED APPLICATIONS

This application is continuation of U.S. Non-Provisional application Ser. No. 17/671,999 filed Feb. 15, 2022, the disclosure of which is hereby incorporated for reference in its entirety.

BACKGROUND

The present disclosure relates, in general, to delay measurement systems and methods for operating the same. Specifically, the present disclosure relates to delay measurement systems and related operating methods for measuring an electronic device.

Many devices comprise circuitry or electronic components that performs various functionality. In an example, the device operates using two voltage levels, such as a first voltage representing a logic "0" and a second voltage representing a logic "1." The device switches between the logic "1" state, and the logic "0" state depending upon operations performed by the device or data stored by the device. However, the delay or latency of the device may occur when switching between different logic states, and it is difficult to accurately measure the delay of the device.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

DETAILED DESCRIPTION

Figure 1A:
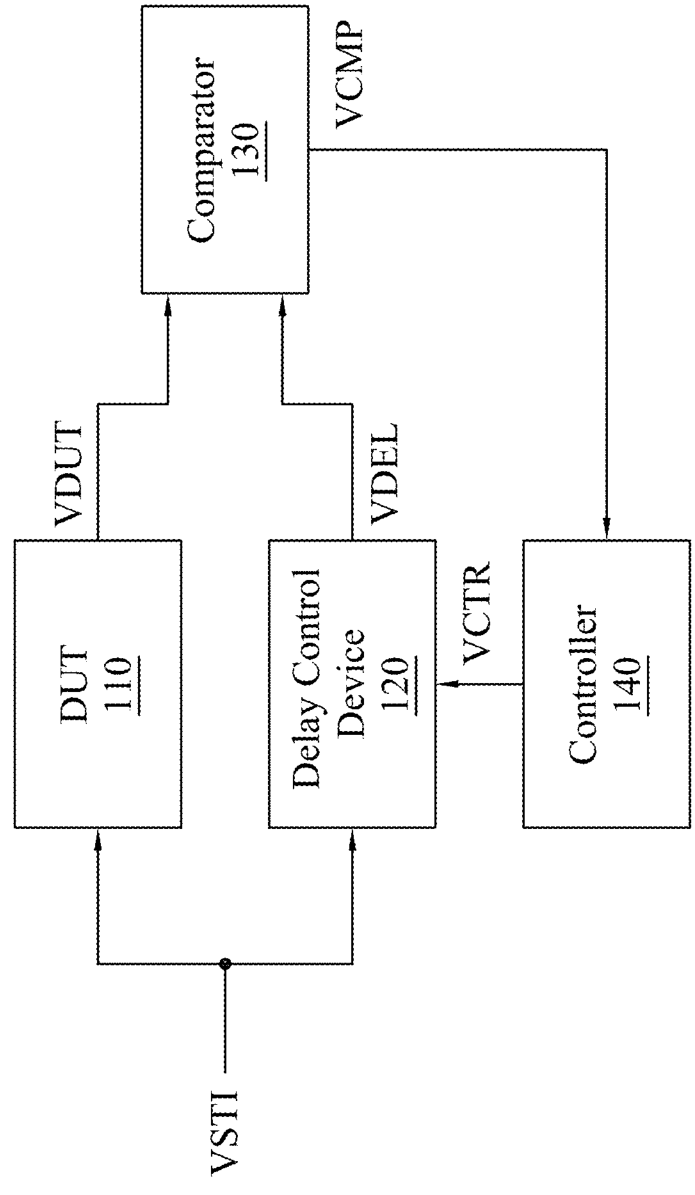
FIG. 1A illustrates a schematic of a delay measurement system, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms “substantially,” “approximately” or “about.” Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A illustrates a schematic of a delay measurement system 10, in accordance with some embodiments of the present disclosure. The delay measurement system 10 includes a device under test (DUT) 110, a delay control device 120, a comparator 130 and a controller 140. In some embodiments, the delay measurement system 10 can be integrated within an integrated circuit. In some embodiments, the delay measurement system 10 provides system on-chip timing characterization data associated with the integrated circuit.

The DUT 110 is configured to receive the signal VSTI and outputs the signal VDUT. The DUT 110 can transmit the signal VDUT to the comparator 130. In some embodiment, the signal VDUT is generated by the DUT 110 in response to the signal VSTI.

The delay control device 120 is configured to receive the signal VSTI and outputs the signal VDEL. The delay control device 120 is configured to receive the signal VSTI and the signal VCTR to generate the signal VDEL. The delay control device 120 can transmit the signal VDEL to the comparator 130. In some embodiment, the signal VDEL is generated by the delay control device 120 in response to the signal VSTI. The signal VDEL can be generated by the delay control device 120 in response to the signal VSTI and the signal VCTR.

The comparator 130 is configured to receive the signal VDUT and the signal VDEL and outputs the signal VCMP. The comparator 130 transmits the signal VCMP to the controller 140. In some embodiment, the comparator 130 can include a D flip-flop. In some embodiment, the comparator 130 can include several D flip-flops.

In some embodiment, the signal VCMP is generated based on the difference or comparison between the signal VDUT and the signal VDEL determined by the comparator 130. The signal VCMP can be determined in response to the comparison between the rising edges of the signal VDUT and the signal VDEL. The signal VCMP can be determined in response to the comparison between the falling edges of the signal VDUT and the signal VDEL.

The controller 140 is configured to receive the signal VCMP. The controller 140 is configured to generate the signal VCTR in response to the signal VCMP. The controller 140 is configured to determine at least one step delay for the delay control device 120. The controller 140 is configured to determine one or more (e.g., one or two) different sets of step delays for the delay control device 120. The signal VCTR can be determined according to the signal VCMP from the comparator 130. In some embodiments, the signal VCTR can be used by the delay control device 120 to adjust the rising edge of the signal VDEL. The signal VCTR can be used by the delay control device 120 to adjust the falling edge of the signal VDEL. Thus, in some embodiments, the signal VDEL can be generated by the delay control device 120 in response to the signal VSTI and the signal VCMP.

The DUT 110, the delay control device 120, the comparator 130 and the controller 140 may be anyone or combination of the following: diode, transistor, resistor, inductor, capacitor logic, memory, integrated passive device (IPD), Micro Electro Mechanical Systems (MEMS), digital signal processor (DSP), microcontroller (MCU), central-processing unit (CPU) or a plurality of parallel processors relating the parallel processing environment to implement the operating system (OS), firmware, driver and/or other applications of an electronic apparatus.

Figure 1B:
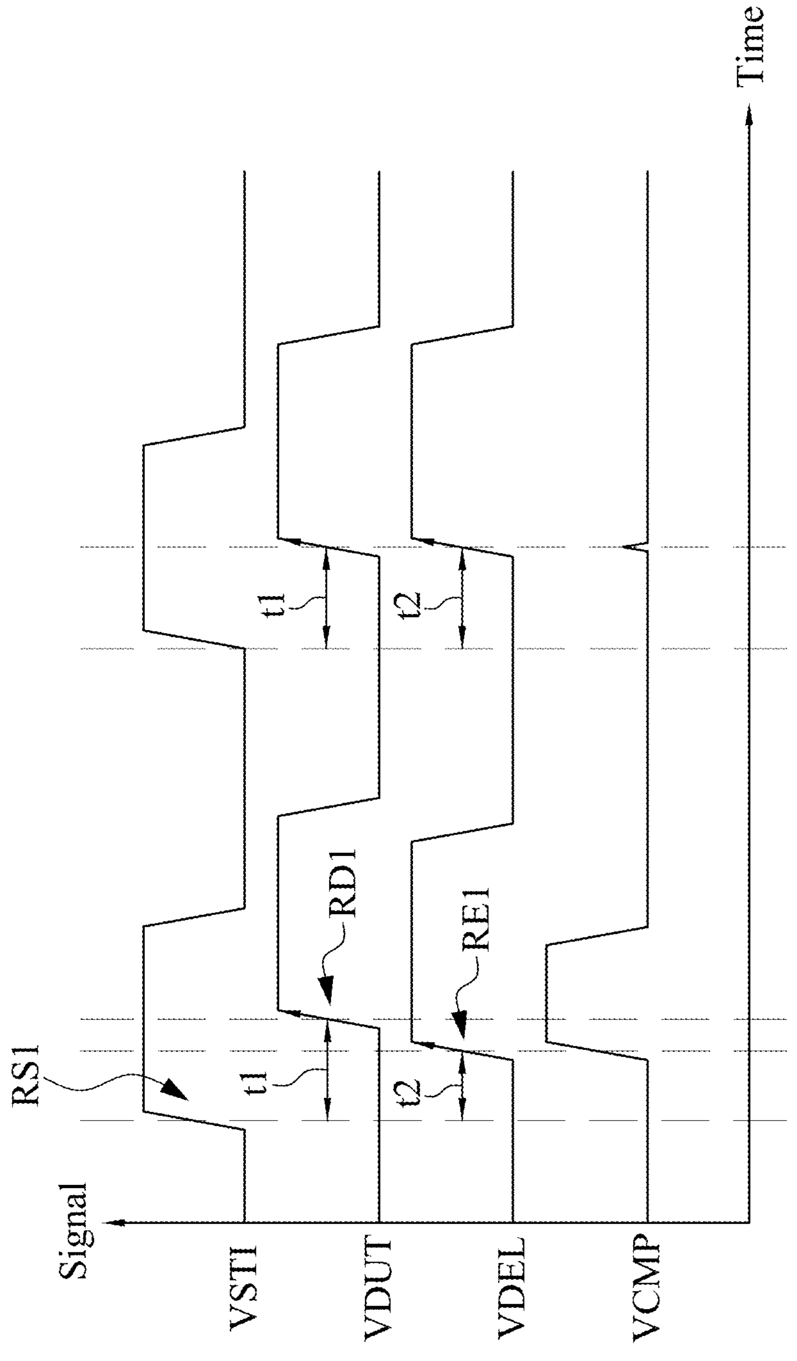
FIG. 1B illustrates a waveform graph depicting operations of the delay measurement system, in accordance with some embodiments of the present disclosure.

FIG. 1B illustrates a waveform graph depicting operations of the delay measurement system 10, in accordance with some embodiments of the present disclosure. The signal VDUT lags behind the signal VSTI by the delay time t1. A gap of the delay time t1 is between the rising edge RS1 of the signal VSTI and the rising edge RD1 of the signal VDUT. In some embodiments, the rising edge RD1 of the signal VDUT delays the delay time t1 with respect to the rising edge RS1 of the signal VSTI. The delay time t1 can be evaluated or measured by the comparator 130. The delay time t1 can be compared with respect to the delay time t2 of the signal VDEL by the comparator 130.

As shown in FIG. 1B, the signal VDEL lags behind the signal VSTI by the delay time t2. A gap of delay time t2 is between the rising edge RS1 of the signal VSTI and the rising edge RE1 of the signal VDEL. In some embodiments, the rising edge RE1 of the signal VDEL delays the delay time t2 with respect to the rising edge RS1 of the signal VSTI. The delay time t2 is controlled in response to the signal VCMP from the comparator 130. The delay time t2 can be evaluated or measured by the comparator 130. The delay time t2 can be compared with respect to the delay time t1 of the signal VDUT by the comparator 130.

The comparator 130 can be configured to compare the delay time t1 and the delay time t2. The comparator 130 is configured to compare the rising edge RD1 of the signal VDUT and the rising edge RE1 of the signal VDEL. When the delay time t2 does not equals to the delay time t1, the signal VCMP is risen for a period by the comparator 130. In some embodiments, the delay time t2 is tuned by the delay control device 120 in response to the signal VCMP when the delay time t1 is not equal to the delay time t2. The delay time t2 can be controlled by the controller 140 in response to the signal VCMP from the comparator 130. Through the tuning of the delay control device 120 and/or the controlling of the controller 140, the delay time t2 can approximate to the delay time t1.

In the case of FIG. 1B, the delay time t2 can be increased by a step delay when the delay time t2 is smaller than the delay time t1. A set of different step delays or a set of identical step delays can be used to increment the delay time t2 when the rising edge RE1 of the signal VDEL advances the rising edge RD1 of the signal VDUT. The delay time t2 can be increased continuously until the delay time t1 is substantially equal to the delay time t2. The delay time t2 can be incremented for multiple times until the delay time t2 approximates to the delay time t1. When the delay time t2 substantially equals to the delay time t1, the signal VCMP is not risen by the comparator 130. Measuring the DUT 110 with the delay measurement system 10, measurements errors will not stacked to influence the accuracy.

Figure 1C:
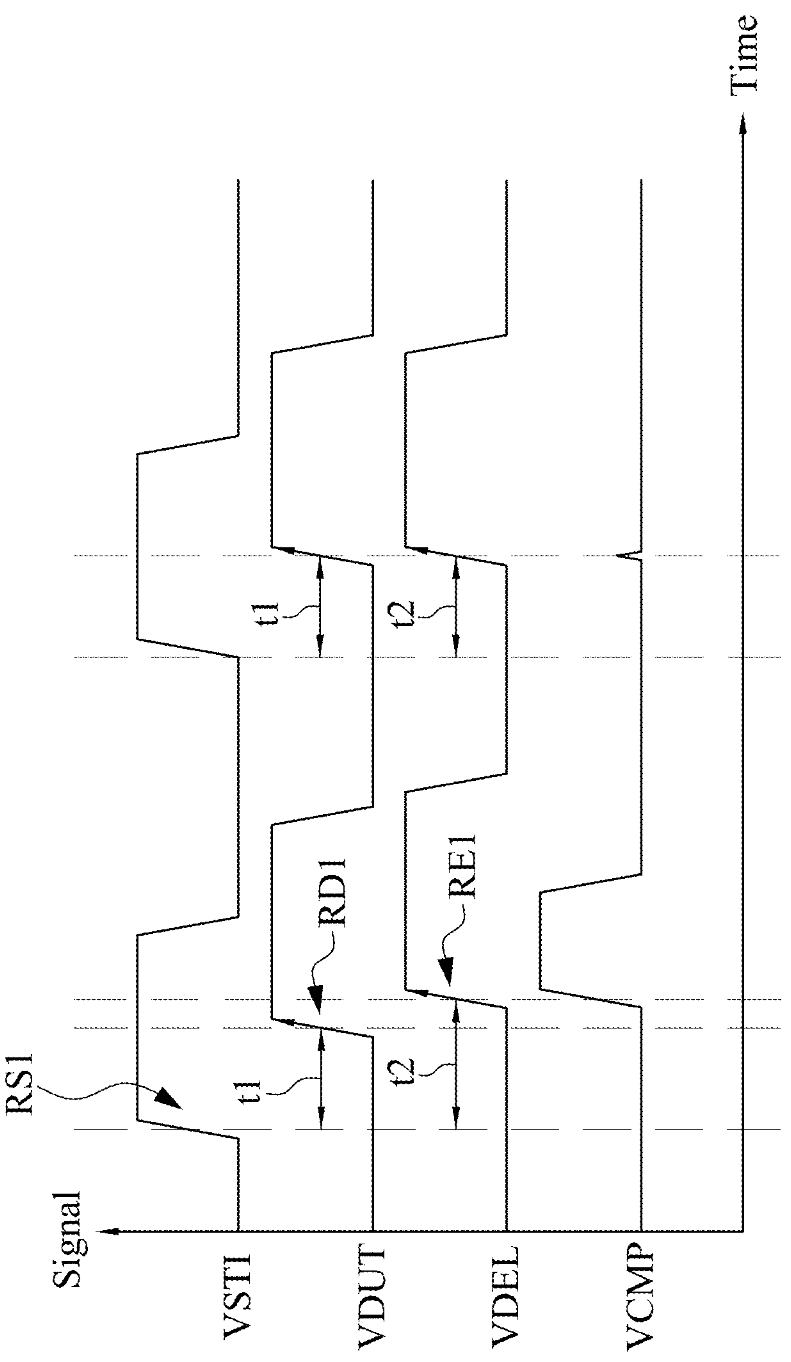
FIG. 1C illustrates a waveform graph depicting operations of the delay measurement system, in accordance with some embodiments of the present disclosure.

FIG. 1C illustrates a waveform graph depicting operations of the delay measurement system, in accordance with some embodiments of the present disclosure. The signal VDUT lags behind the signal VSTI by the delay time t1. A gap of delay time t1 is between the rising edge RS1 of the signal VSTI and the rising edge RD1 of the signal VDUT. In some embodiments, the rising edge RD1 of the signal VDUT delays the delay time t1 with respect to the rising edge RS1 of the signal VSTI. The delay time t1 can be evaluated or measured by the comparator 130. The delay time t1 can be compared with respect to the delay time t2 of the signal VDEL by the comparator 130.

As shown in FIG. 1C, the signal VDEL lags behind the signal VSTI by the delay time t2. A gap of delay time t2 is between the rising edge RS1 of the signal VSTI and the rising edge RE1 of the signal VDEL. In some embodiments, the rising edge RE1 of the signal VDEL delays the delay time t2 with respect to the rising edge RS1 of the signal VSTI. The delay time t2 is controlled in response to the signal VCMP of the comparator 130. The delay time t2 can be evaluated or measured by the comparator 130. The delay time t2 can be compared with respect to the delay time t1 of the signal VDUT by the comparator 130.

The comparator 130 can be configured to compare the delay time t1 and the delay time t2. The comparator 130 is configured to compare the rising edge RD1 of the signal VDUT and the rising edge RE1 of the signal VDEL. When the delay time t2 does not equals to the delay time t1, the signal VCMP is risen for a period by the comparator 130. In some embodiments, the delay time t2 is tuned by the delay control device 120 in response to the signal VCMP when the delay time t1 is not equal to the delay time t2. The delay time t2 can be controlled by the controller 140 in response to the signal VCMP from the comparator 130. Through the tuning of the delay control device 120 and/or the controlling of the controller 140, the delay time t2 can approximate to the delay time t1.

In the case of FIG. 1C, the delay time t2 can be decreased by a step delay when the delay time t2 is greater than the delay time t1. A set of different step delays or a set of identical step delays can be used to decrement the delay time t2 when the rising edge RE1 of the signal VDEL lags behind the rising edge RD1 of the signal VDUT. The delay time t2 can be decreased continuously until the delay time t1 is substantially equal to the delay time t2. The delay time t2 can be decremented for multiple times until the delay time t2 approximates to the delay time t1. When the delay time t2 substantially equals to the delay time t1, the signal VCMP is not risen by the comparator 130. Measuring the DUT 110 with the delay measurement system 10, measurements errors will not stacked to influence the accuracy.

Figure 2A:
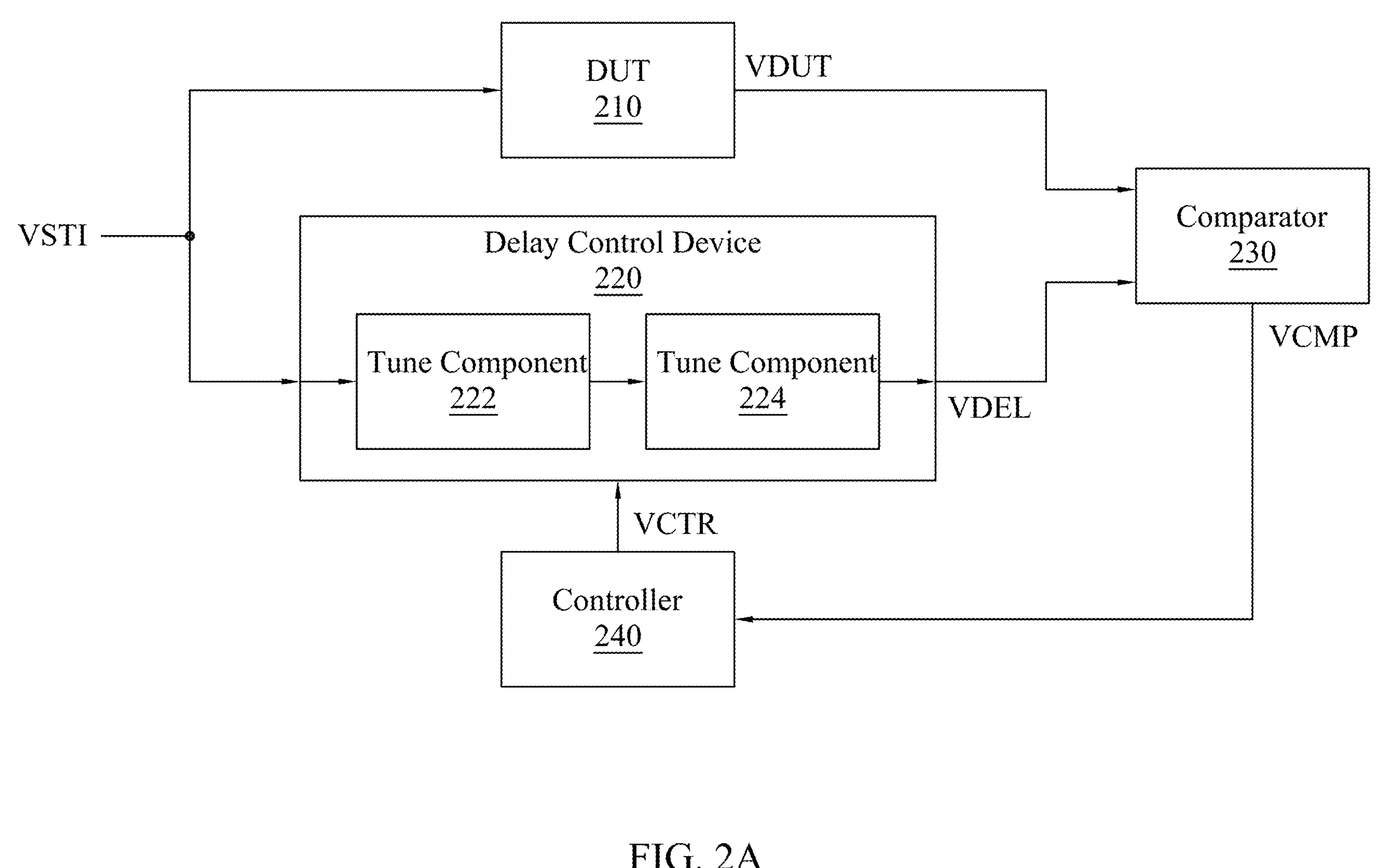
FIG. 2A illustrates a schematic of a delay measurement system, in accordance with some embodiments of the present disclosure.

FIG. 2A illustrates a schematic of a delay measurement system 20, in accordance with some embodiments of the present disclosure. The delay measurement system 20 can include a DUT 210, a delay control device 220, a comparator 230 and a controller 240. The delay control device 220 can include two tune components 222 and 224. The tune component 222 is different from the tune component 224. In some embodiments, delay control device 220 can be DCDL (delay controlled delay line) device. In some embodiments, the tune components 222 and 224 can be DCDL components.

In some embodiments, one of the tune components 222 and 224 can be configured to execute coarse tunings, and the other one of the tune components 222 and 224 can be configured to execute fine tunings. In some embodiments, the step delays used for the coarse tuning are greater than the step delays used for the fine tuning. Each step delay in the coarse tuning can be different from each other. Each step delay in the coarse tuning can be identical to each other. Each step delay in the fine tuning can be different from each other. Each step delay in the fine tuning can be identical to each other.

Figure 2B:
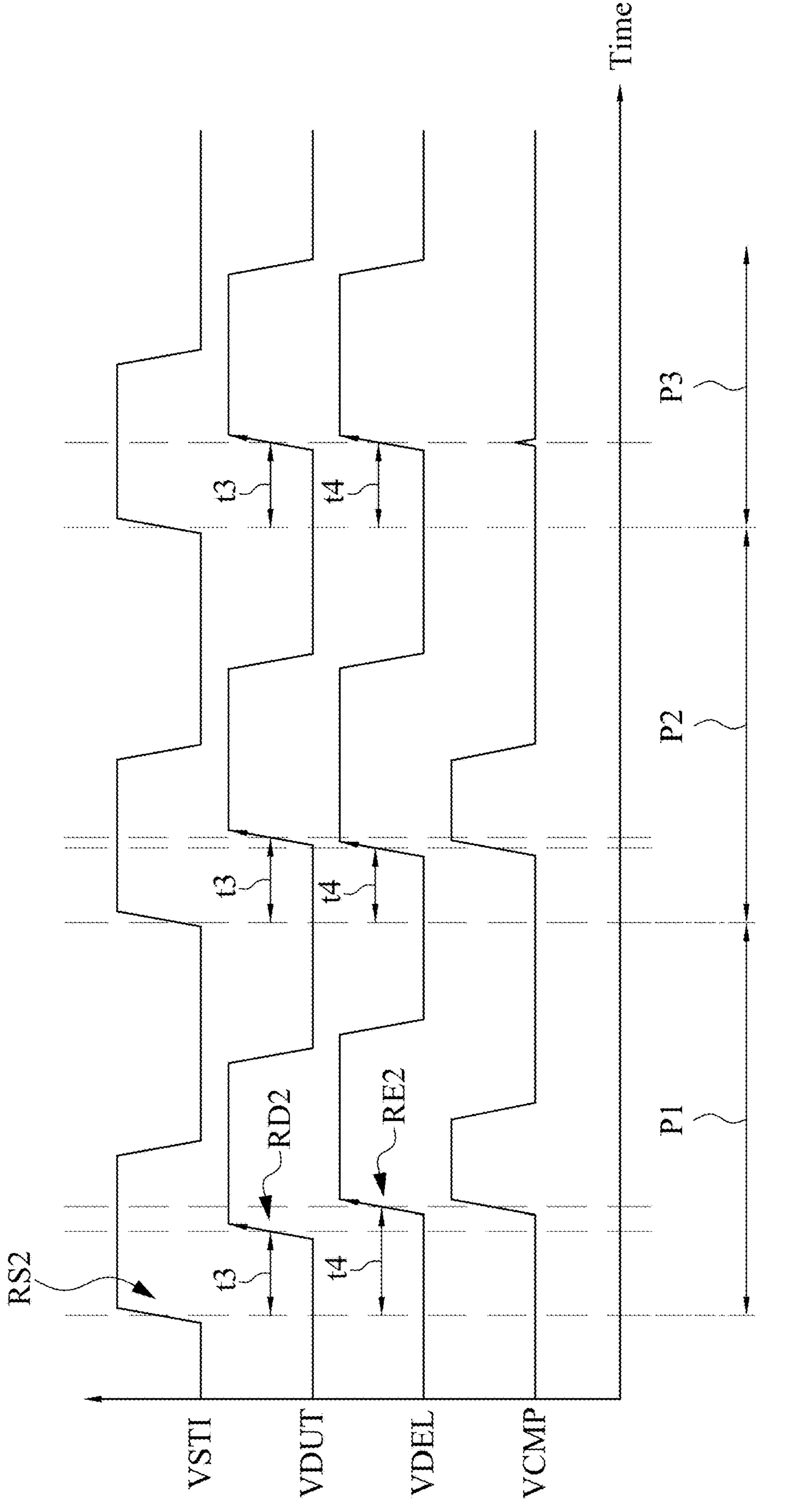
FIG. 2B illustrates a waveform graph depicting operations of the delay measurement system, in accordance with some embodiments of the present disclosure.

FIG. 2B illustrates a waveform graph depicting operations of the delay measurement system 20, in accordance with some embodiments of the present disclosure. The signal VDUT lags behind the signal VSTI by the delay time t3. A gap of delay time t3 is between the rising edge RS2 of the signal VSTI and the rising edge RD2 of the signal VDUT. In some embodiments, the rising edge RD2 of the signal VDUT delays the delay time t3 with respect to the rising edge RS2 of the signal VSTI. The delay time t3 can be evaluated or measured by the comparator 230. The delay time t3 can be compared with respect to the delay time t4 of the signal VDEL by the comparator 230.

As shown in FIG. 2B, the signal VDEL lags behind the signal VSTI by the delay time t4. A gap of delay time t4 is between the rising edge RS2 of the signal VSTI and the rising edge RE2 of the signal VDEL. In some embodiments, the rising edge RE2 of the signal VDEL delays the delay time t4 with respect to the rising edge RS2 of the signal VSTI. The delay time t4 is controlled in response to the signal VCMP of the comparator 130. The delay time t4 can be evaluated or measured by the comparator 130. The delay time t4 can be compared with respect to the delay time t1 of the signal VDUT by the comparator 130.

In some embodiments, the delay time t4 can be tuned or adjusted by the tune component 222 by a first step delay. In some embodiments, the delay time t4 can be tuned or adjusted by the tune component 224 by a second step delay. The second step delay can be smaller than the first step delay. The second step delay can be greater than the first step delay. The second step delay can be the same as the first step delay. In some embodiments, the delay time t4 can be tuned by the tune components 222 and 224 respectively. In some embodiments, the delay time t4 can be adjusted sequentially or respectively by the tune components 222 and 224.

In some embodiments, the delay time t4 can be decreased by the tune component 222 and increased by the tune component 224. In some embodiments, the delay time t4 can be increased by the tune component 222 and decreased by the tune component 224. In some embodiments, the tune components 222 and 224 can advance or postpone the rising edge of the delay time t4. In some embodiments, the tune components 222 and 224 can advance or postpone the falling edge of the delay time t4.

Referring to FIG. 2A and FIG. 2B, when the delay time t4 is greater than the delay time t3 as illustrated in the period P1, the signal VCMP is triggered or risen by the comparator 230 and transmitted to the controller 240. The signal VCTR is generated in response to the signal VCMP to enable the tune component 222 of the delay control device 220 performing the coarse tuning. The coarse tuning can be utilized to quickly approximate the delay time t4 to the delay time t3 with relatively big step delays.

During the coarse tuning, the delay time t4 can be decreased by a step delay when the delay time t4 is greater than the delay time t3. A set of different step delays or a set of identical step delays can be used to decrement the delay time t4 until the delay time t4 is smaller than the delay time t3. The delay time t4 can be decremented for multiple times until the delay time t4 is approximates to and is smaller than the delay time t3. For example, the coarse tuning is ceased once the comparator 230 detects that the delay time t4 is smaller than the delay time t3.

When the delay time t4 is smaller than the delay time t3 as illustrated in the period P2 of FIG. 2B, the signal VCMP is triggered or risen by the comparator 230 and transmitted to the controller 240. The signal VCTR is generated in response to the signal VCMP to enable the tune component 224 of the delay control device 220 for performing the fine tuning. The fine tuning can be utilized to further approximate the delay time t4 to the delay time t3 with relatively small step delays.

During the fine tuning, the delay time t4 can be increased by a step delay when the delay time t4 is smaller than the delay time t3. A set of different step delays or a set of identical step delays can be used to increment the delay time t4 until the delay time t4 is greater than the delay time t3. The delay time t4 can be incremented for multiple times until the delay time t4 is greater than and is substantially equal to the delay time t3 as shown in the period P3. In some embodiments, the fine tuning is ceased once the comparator 230 detects that the delay time t4 is greater than the delay time t3.

By utilizing the coarse tuning and the fine tuning, the delay time of the DUT 210 can be measured and evaluated due to the accurate approximation. More specifically, the coarse tuning is performed to quickly approximate to the delay time of the DUT 210, then the fine tuning is performed to further approximate the delay time of the DUT 210. Measuring the DUT 210 with the delay measurement system 20, measurements errors will not stacked to influence the accuracy. In addition, the measurement accuracy can be improved by reusing the same edge-triggered comparator to avoid variation across different electronic components.

Therefore, compared to the a measurement system which measure a DUT by stacking different numbers of electronic components having same delay time in series, the measurement speed can be accelerated and the accuracy can be enhanced by utilizing the present disclosure. The reasons include that the measurement systems of the present disclosure (e.g., the delay measurement system 10 and the delay measurement system 20) uses a controlled delay time to approximate to the delay time of the DUT, in which the controlled delay time is tuned or adjusted in response to an edge-triggered comparator. In addition, the measurement system 20 measure the delay time of the DUT faster and more accurate by using the coarse and fine loops adjusted by the edge-triggered comparator.

Figure 2C:
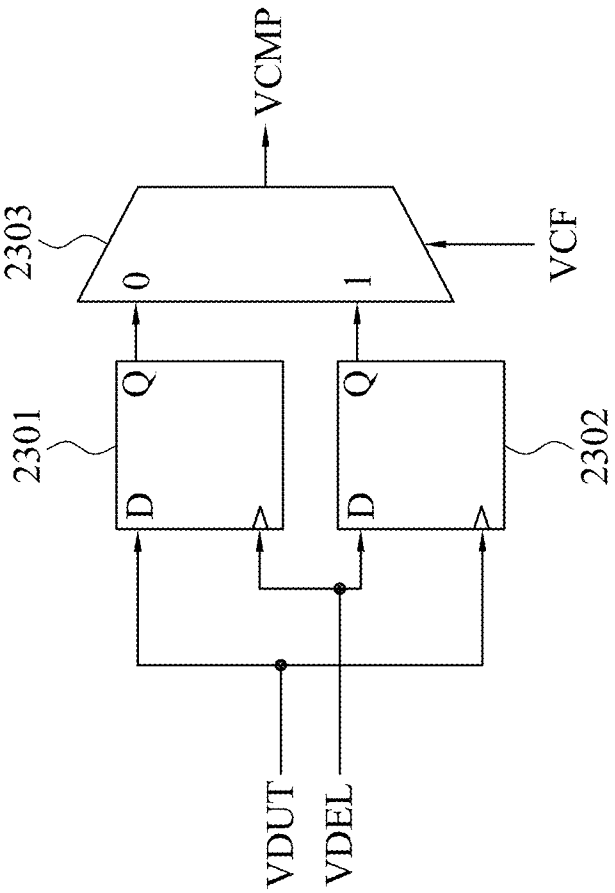
FIG. 2C illustrates a schematic of a comparator, in accordance with some embodiments of the present disclosure.

FIG. 2C illustrates a schematic of a comparator 230, in accordance with some embodiments of the present disclosure. The comparator 230 can include a D flip-flop 2301, a D flip-flop 2302 and a multiplexer 2303. Each of the D flip-flops 2301 and 2302 has a clock input and a data input.

As shown in FIG. 2C, the D flip-flop 2301 can be configured to receive the signal VDUT as a data and receive the signal VDEL as a clock, and the D flip-flop 2302 can be configured to receive the signal VDUT as a clock and receive the signal VDEL as a data. In some other embodiments, the D flip-flop 2301 can be configured to receive the signal VDUT as a clock and receive the signal VDEL as a data, and the D flip-flop 2302 can be configured to receive the signal VDUT as a data and receive the signal VDEL as a clock.

In some embodiment, the multiplexer 2303 can be configured to output of an output of the D flip-flop 2301 or an output of the D flip-flop 2302 based on whether the tune component 222 or the tune component 224 is enabled. The signal VCMP can be determined based on the outputs of the tune components 222 and 224. In some other embodiments, the multiplexer 2303 can be configured to output of an output of the D flip-flop 2301 or an output of the D flip-flop 2302 based on whether the coarse tune component 222 or the fine tune component 224 is enabled. The signal VCMP can be adjusted in response to the signal VCF which indicates which one of the coarse tuning or the fine tuning will be performed.

In some embodiment, the signal VCF is determined according to the coarse tuning and fine tuning of the delay control device 220. When the coarse tuning is performed, the signal VDUT leads or advances the signal VDEL, and the signal VCF is set to 0. In FIG. 2C, when VCF is set to 0, the multiplexer 2303 outputs the output of D flip-flop 2301. Accordingly, the D flip-flops 2301 and 2302 are configured to sample the signal VDUT with the trailing signal VDEL and transmit output to the multiplexer 2303 for generating the signal VCMP.

In some embodiment, when the fine tuning is performed, the signal VDEL leads or advances the signal VDUT, and the signal VCF is set to 1. In FIG. 2C, when VCF is set to 1, the multiplexer 2303 outputs the output of D flip-flop 2302. Accordingly, the D flip-flops 2301 and 2302 are configured to sample the signal VDEL with the trailing signal VDUT and transmit output to the multiplexer 2303 for generating the signal VCMP.

Figure 3A:
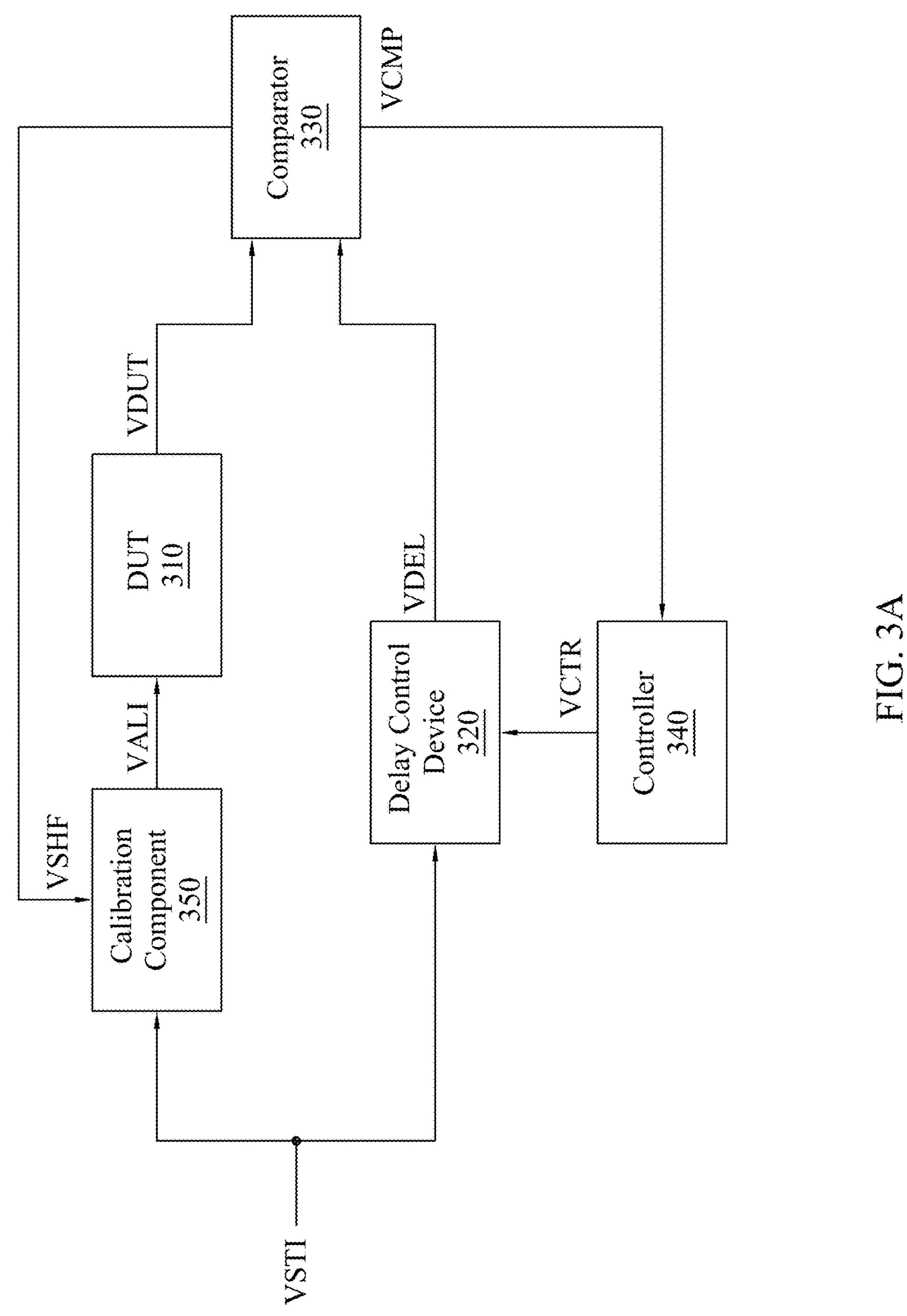
FIG. 3A illustrates a schematic of a delay measurement system, in accordance with some embodiments of the present disclosure.

FIG. 3A illustrates a schematic of a delay measurement system 30, in accordance with some embodiments of the present disclosure. The delay measurement system 30 includes a DUT 310, a delay control device 320, a comparator 330, a controller 340 and a calibration component 350. The calibration component 350 can be DCDL component. The calibration component 350 can be configured to evaluate or provide an offset time for the DUT 310. The calibration component 350 is coupled to an input of the DUT 310 for delivering the signal VALI. The signal VALI can be generated in response to the signal VSHF from the comparator 330 and the signal VSTI. The DUT 301 generates the signal VDUT in response to the signal VALI.

Figure 3B:
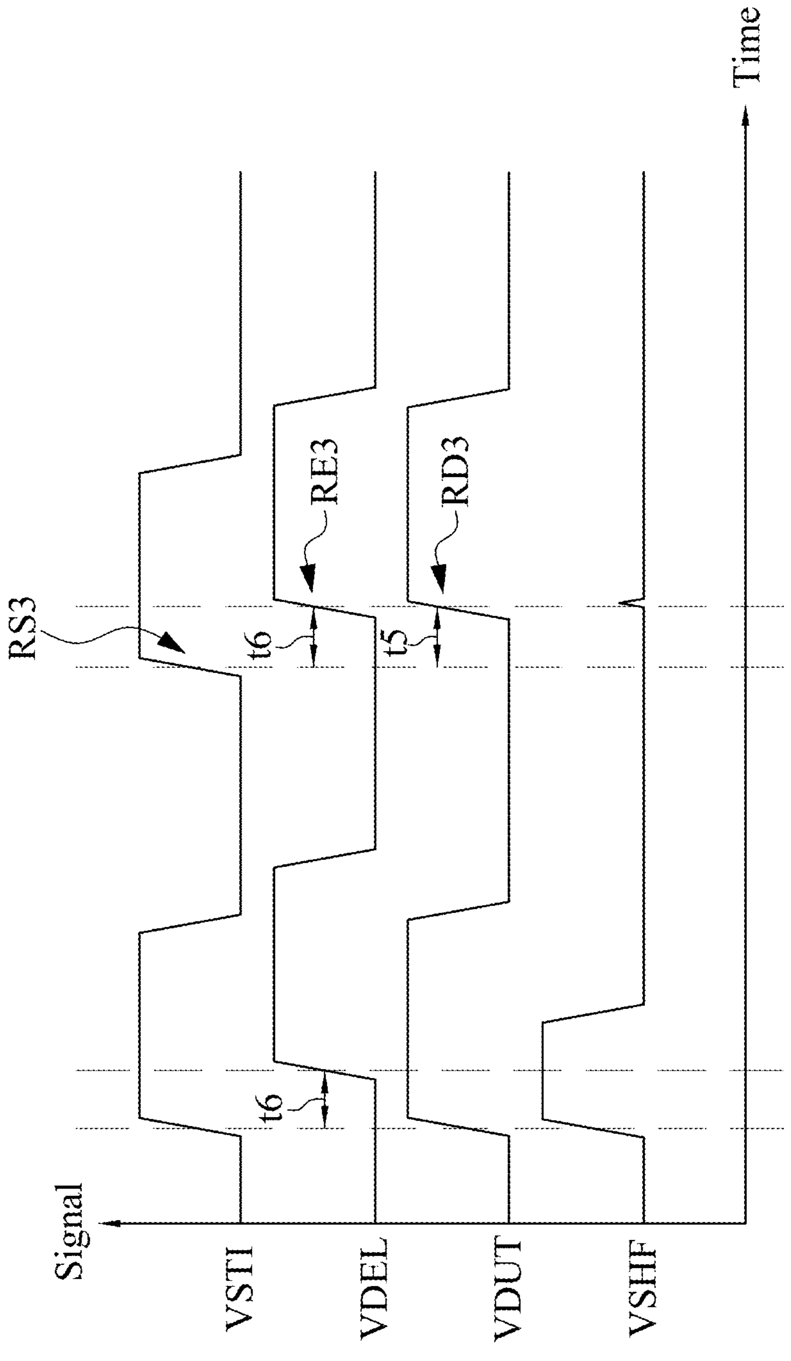
FIG. 3B illustrates a waveform graph depicting operations of the delay measurement system, in accordance with some embodiments of the present disclosure.

FIG. 3B illustrates a waveform graph depicting operations of the delay measurement system 30, in accordance with some embodiments of the present disclosure. In FIG. 3B, the signal VDEL lags behind the signal VSTI by the offset time t6. The rising edge of the signal VDEL delays the offset time t6 with respect to the rising edge of the signal VSTI. Without providing the offset time t5 generated by the calibration component 350, the signal VDUT generated by the DUT 310 may not delay with respect to the rising edge of the signal VSTI when the DUT 310 is a simple electrical component (e.g., a resistor or a wire). When the offset time t6 does not equals to the delay time generated by the DUT 310, the signal VSHF is risen for a period by the comparator 330.

In some embodiment, the calibration component 350 can be configured to provide an offset time t5 to the DUT 310 in response to the signal VSHF. In response to the signal VSHF being risen, the calibration component 350 can be configured to provide an offset time t5 to the DUT 310. When the offset time t5 is tuned to substantially equal to the offset time t6, the signal VSHF is not risen by the comparator 330 . . . . The offset time t6 occurs at the delay control device 320 when the delay time of the signal VDEL is set to zero.

Therefore, edge alignment for the signals VDEL and VDUT can be achieved by providing the offset time t5, and thus the accuracy of delay measurement can be improved. In some embodiment, the measurement accuracy can be improved by utilizing the delay measurement 300 with the self-calibration and the coarse and fine tunings.

Figure 4:
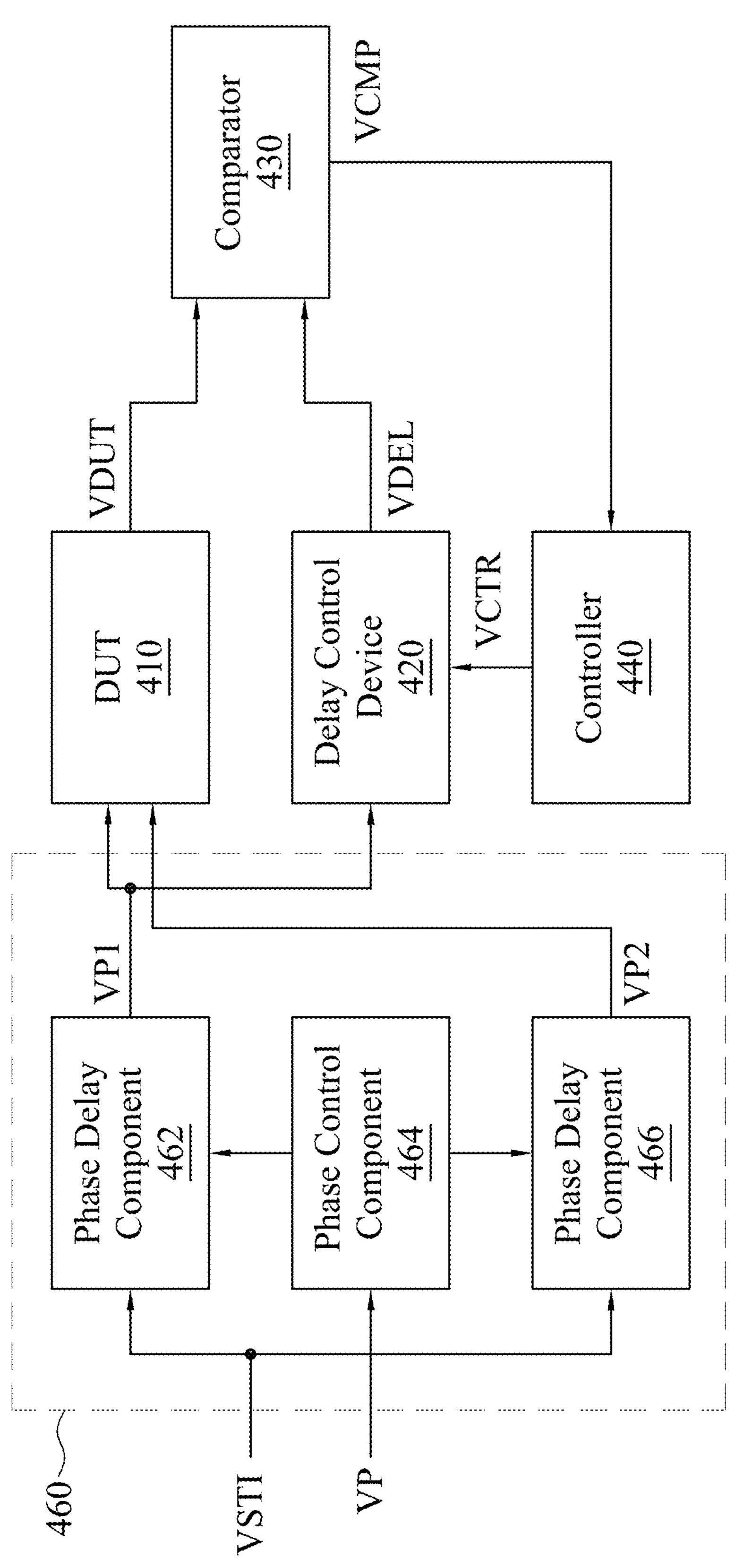
FIG. 4 illustrates a schematic of a delay measurement system, in accordance with some embodiments of the present disclosure.

FIG. 4 illustrates a schematic of a delay measurement system 40, in accordance with some embodiments of the present disclosure. The delay measurement system 40 includes a DUT 410, a delay control device 420, a comparator 430, a controller 440 and a phase generator 460. The phase generator 460 can include a phase delay component 462, a phase control component 464 and a phase delay component 466. The phase generator 460 can be configured to split or divide a single signal VSTI into two phase signals VP1 and VP2. The phase generator 460 can be configured to generate signals VP1 and VP2 in response to a single signal VSTI. The signals VP1 and VP2 may have the same phase or different phases.

In some embodiments, the phase control component 464 can be configured to receive a phase control signal VP. The phase control signal VP can include the targeted phase information for the phase control component 464 to adjust the phase delay components 462 and 466. The phase delay component 462 can be configured to generate the phase signal VP1 in response to a first output of the phase control component 464 and the signal VSTI. The phase delay component 466 can be configured to generate the second phase signal VP2 in response to a second output of the phase control component 464 and the signal VSTI.

In some embodiment, one of the phase signal VP1 and the phase signal VP2 works as a data signal, and the other one of the phase signal VP1 and the phase signal VP2 works as a clock signal. In some embodiments, the DUT 410 can be stimulated by the phase signal VP1 or VP2. In some embodiments, the DUT 410 can be stimulated by the phase signal VP1 and the phase signal VP2. In some embodiments, the delay control device 420 can be stimulated by the phase signal VP1 or VP2. In some embodiments, the delay control device 420 can be stimulated by the phase signal VP1 and the phase signal VP2. In an embodiment of FIG. 4, one of the phase signal VP1 and the phase signal VP2 works as a data signal of the DUT 410, and the other one of the phase signal VP1 and the phase signal VP2 works as a clock signal of the DUT 410. In an embodiment of FIG. 4, the delay control device 420 generate the signal VDEL in response to the phase signal VP1.

In some embodiment, the phase signal VP1 and the phase signal VP2 may have the same phase or different phases. In some embodiment, the phase of one of the phase signal VP1 and the phase signal VP2 can be zero, and the phase of the other one of the phase signal VP1 and the phase signal VP2 can be a positive value. In some embodiment, the phase of the phase signal VP1 is zero and the phase of the phase signal VP2 is a positive value; when applied to the DUT 410, the phase of the phase signal VP1 can still be zero and the phase of the phase signal VP2 can still be a positive value.

Figure 5:
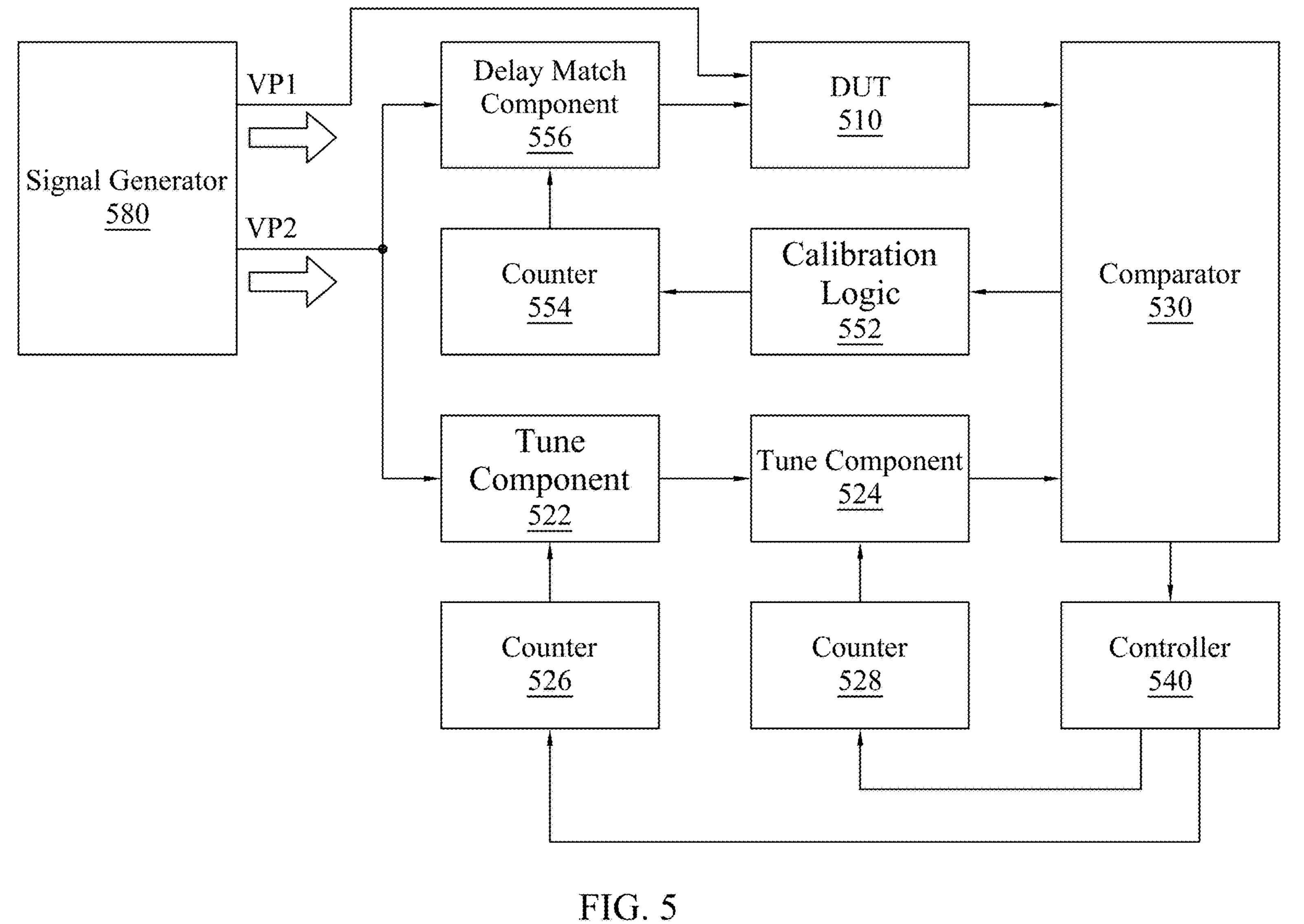
FIG. 5 illustrates a schematic of a delay measurement system, in accordance with some embodiments of the present disclosure.

FIG. 5 illustrates a schematic of a delay measurement system 50, in accordance with some embodiments of the present disclosure. The delay measurement system 50 can include a DUT 510, two tune components 522 and 524, two counters 526 and 528, a comparator 530, a controller 540, a calibration logic 552, a counter 554, a delay match component 556, and a signal generator 580. In some embodiments, the tune components 522 and 524 and the counters 526 and 528 can be included by a delay control device. The calibration logic 552, the counter 554 and the delay match component 556 can be included by a calibration component. In some embodiments, the above component, device, logic, counter or controller can be implemented by DCDL. For example, the tune components 522 and 524 and the delay match component 556 may be implemented by one or more DCDL devices.

In some embodiments, the signal generator 580 is configured to generate the phase signals VP1 and VP2. The phase signal VP1 can be transmitted to the DUT 510. The phase signal VP2 can be transmitted to the tune component 522 and the delay match component 556. The tune component 522 and the tune component 524 can be configured to perform the coarse tuning with large step delays and the fine tuning with small step delays, respectively. In some embodiments, the maximum of the small step delays can be greater than the minimum of the large step delays. The average of the small step delays is smaller than the average of the large step delays.

Now referring to FIG. 2B and FIG. 4, in some embodiments, the counter 526 is coupled to the tune component 522 and configured to downcount to decrement the delay time t4 as shown in FIG. 2B. Additionally, the counter 528 is coupled to the tune component 524 and is configured to upcount to increment the delay time t4. In some embodiment, the counter 526 can count from high bit value to low bit value, and the counter 528 can count from low bit value to high bit value. In some embodiment, the counter 526 can count from 111111 down to 000000, and the counter 528 can count from 00000 up to 11111. In some embodiment, the bit value is proportional to the delay time. In some embodiment, the greater the bit value, the longer the delay time.

In some embodiments, the intrinsic delay time may occur in at least one of the components of the delay measurement system 50. The offset delay time can be evaluated and generated to compensate for the intrinsic delay time. In some embodiments, the offset delay time can be determined by setting the counter 526 to 000000 and setting the counter 528 to 00000 so that the intrinsic delay time can be measured or evaluated. The delay match component 556 can be adjusted by the calibration logic 552 through the counter 554 which downcounts from 111111111 to 000000000. In some embodiments, when the counter 554 has the equal delay time (or the offset time) generated by the tune component 522 (set to 000000) and the tune component 524 (set to 00000), the counter 554 can stop downcounting.

In some embodiments, the controller 540 firstly enables the counter 526. The counter 526 can count from 111111 down to 000000 to decrease the delay time of the tune component 522. When the comparator 530 detects or senses that delay path of the coarse tuning is faster than that of the DUT 510, the counter 526 can stop counting. When the counter 526 stops counting, the controller 540 hands over the control to the counter 528. The counter 528 can count from 00000 to 11111, and it can gradually increase the delay time of tune component 524 until the total delay time of the coarse tuning and the fine tuning equals to the delay time of the DUT 510.

Figure 6:
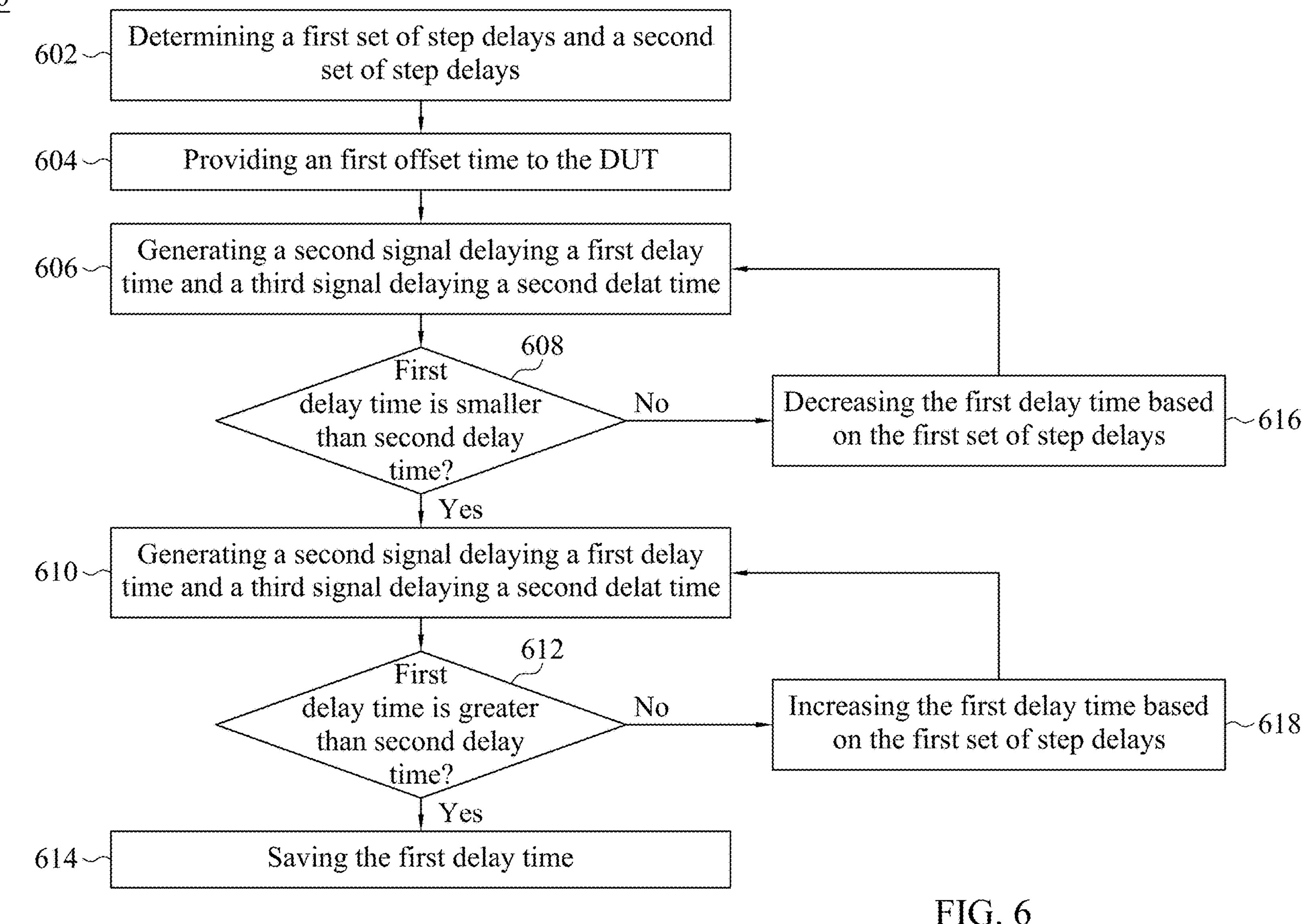
FIG. 6 illustrates a flow chart including operations for a measurement method, in accordance with some embodiments of the present disclosure.

FIG. 6 illustrates a flow chart including operations for a measurement method 600, in accordance with some embodiments of the present disclosure. In the operation 602, a first set of step delays and a second set of step delays are determined. In the operation 604, a first offset time is provided to the DUT. In the operation 606, a second signal delaying a first delay time and a third signal delaying a second delay time are generated. In the operation 608, whether the first delay time is smaller than second delay time is determined.

If the first delay time is smaller than second delay time, the operation 610 will be executed. In the operation 610, a second signal delaying a first delay time and a third signal delaying a second delay time are generated. If the first delay time is not smaller than second delay time, the operation 616 will be executed. In the operation 616, the first delay time is decreased based on the first set of step delays. That is, when the first delay time is not smaller than the second delay time, the first delay time is decreased based on the first set of step delays until the first delay time is smaller than the second delay time.

In the operation 612, whether the first delay time is greater than second delay time is determined. If the first delay time is greater than second delay time, the operation 614 will be executed. In the operation 614, the first delay time is saved. If the delay time is not greater than second delay time, the operation 618 will be executed. In the operation 618, the first delay time is increased based on the first set of step delays. That is, when the first delay time is not greater than the second delay time, the first delay time is increased based on the second set of step delays until the first delay time is greater or is approximate to than the second delay time.

Figure 7A:
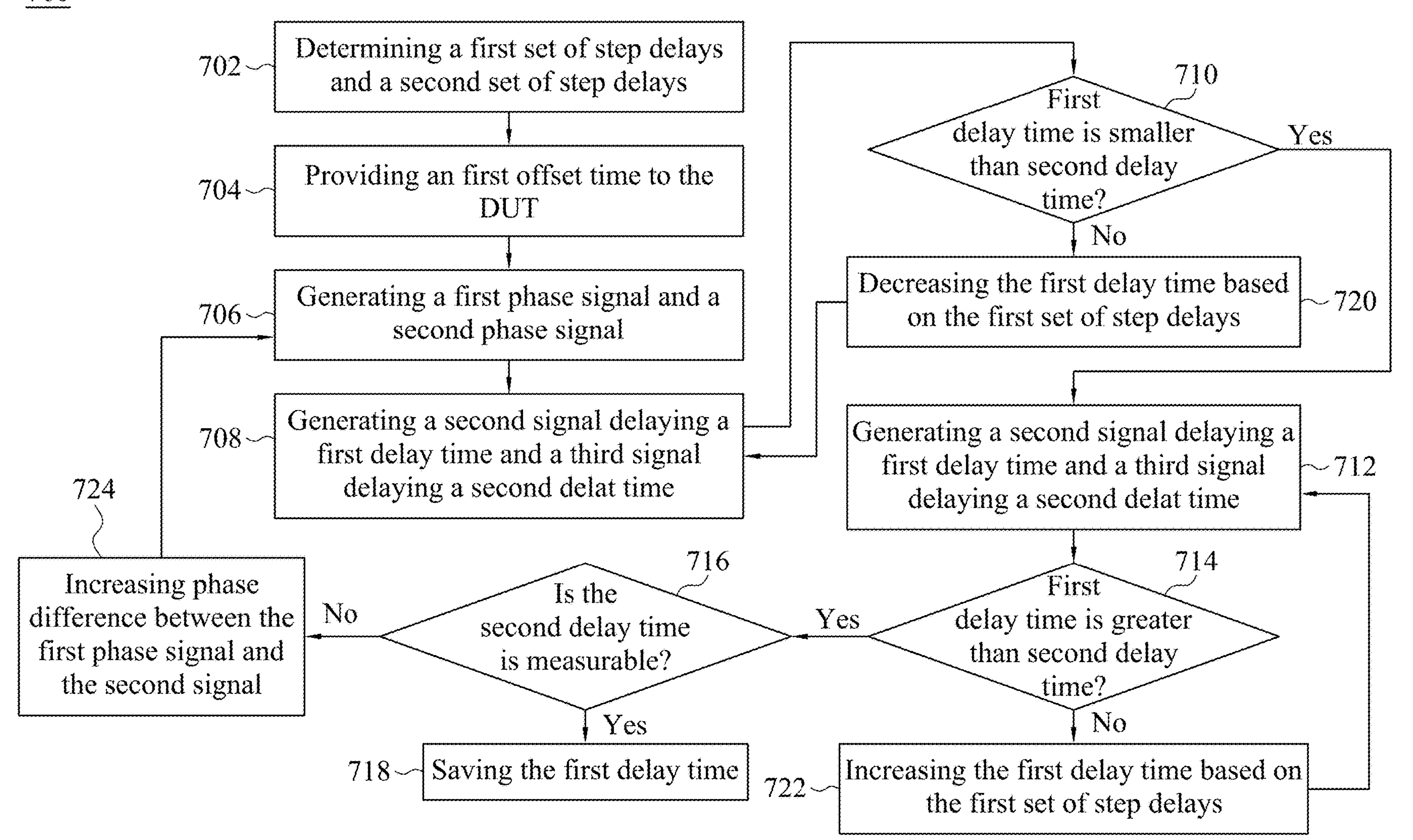
FIG. 7A illustrates a flow chart including operations for a measurement method, in accordance with some embodiments of the present disclosure.

FIG. 7A illustrates a flow chart including operations for a measurement method 700, in accordance with some embodiments of the present disclosure. In the operation 702, a first set of step delays and a second set of step delays are determined. In the operation 704, a first offset time is provided to the DUT. In the operation 706, a first phase signal and a second phase signal are generated. In the operation 708, a second signal delaying a first delay time and a third signal delaying a second delay time are generated. In the operation 710, whether the first delay time is smaller than second delay time is determined.

If the first delay time is smaller than second delay time, the operation 712 will be executed. In the operation 712, a second signal delaying a first delay time and a third signal delaying a second delay time are generated. If the first delay time is not smaller than second delay time, the operation 720 will be executed. In the operation 720, the first delay time is decreased based on the first set of step delays. That is, when the first delay time is not smaller than the second delay time, the first delay time is decreased based on the first set of step delays until the first delay time is smaller than the second delay time.

In the operation 714, whether the first delay time is greater than second delay time is determined. If the first delay time is greater than second delay time, the operation 716 will be executed. If the delay time is not greater than second delay time, the operation 722 will be executed. In the operation 722, the first delay time is increased based on the first set of step delays. That is, when the first delay time is not greater than the second delay time, the first delay time is increased based on the second set of step delays until the first delay time is greater or is approximate to than the second delay time.

In the operation 716, it determines whether the second delay time is measurable. If the second delay time is measurable, the operation 718 will be executed. In the operation 718, the first delay time is saved. If the second delay time is not measurable, the operation 724 will be executed. In the operation 724, the phase difference between the first phase signal and the second signal is increased. After the operation 724, operation 706 is executed. That is, operation 718 will be performed until the second delay time is measurable.

Figure 7B:
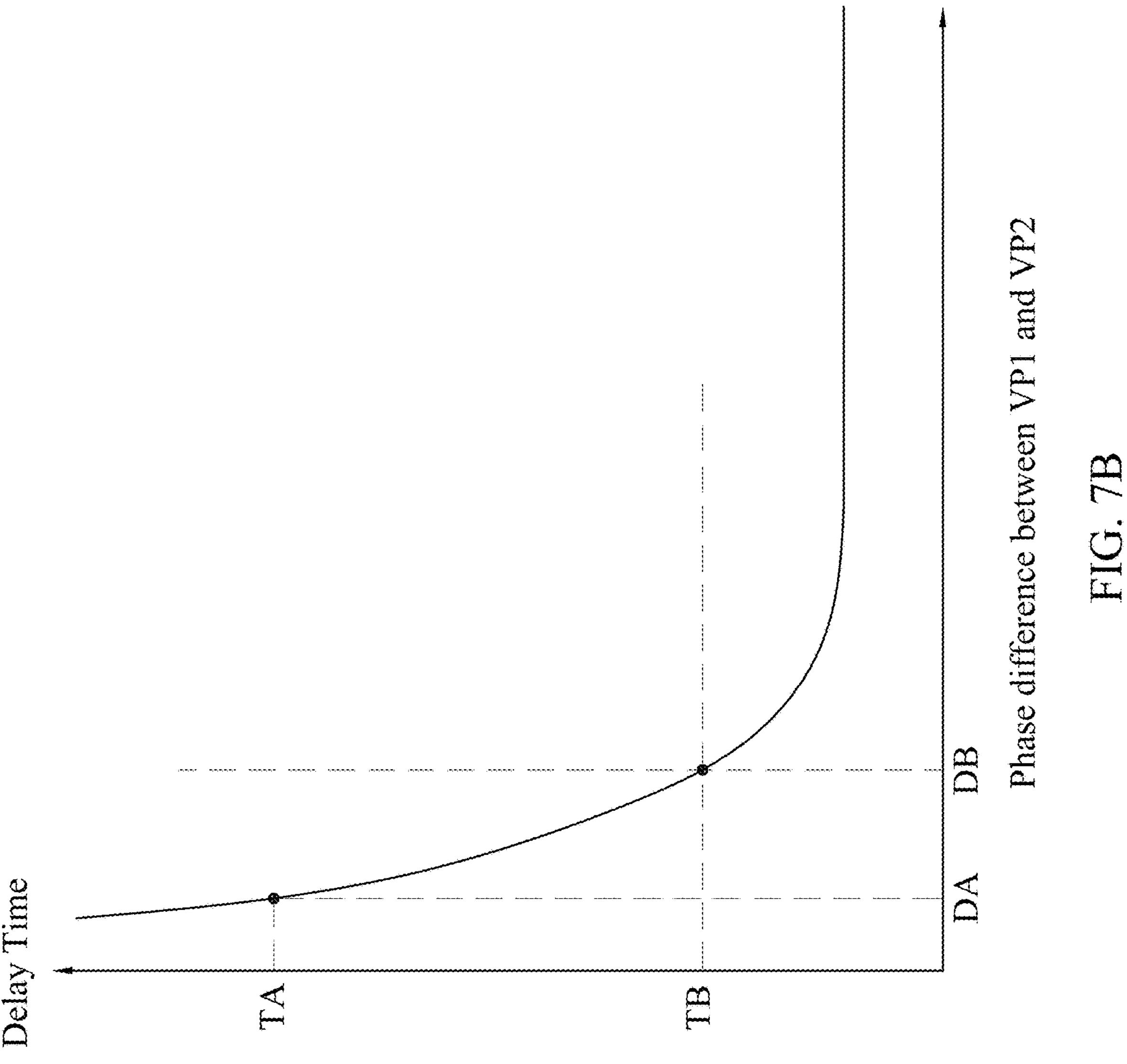
FIG. 7B illustrates a diagram of delay time and phase difference, in accordance with some embodiments of the present disclosure.

More details on determining whether the second delay time is measurable are provided in FIG. 7B which illustrates a diagram of delay time and phase difference, in accordance with some embodiments of the present disclosure. When the phase difference between the phase signals VP1 and VP2 is set to zero, the corresponding delay time can be regarded as infinite because the corresponding delay time is too high to be measured. As the phase difference between the phase signals VP1 and VP2 increases, the delay time can be decreasing. For example, the delay time TA corresponds to the phase difference DA, and the delay time TA still exceeds to the measurement range for the delay measurement system to be detected.

In some embodiment, the phase difference between the phase signal VP1 and the phase signal VP2 is increased until the delay time adjusted by the delay control device can be measured. When the phase difference is increased to DB, the delay time can be decreased to TB so that it can be detected or measured. For example, when the delay time TB is the first delay time detected by the measurement system, the delay time TB will be saved.

Figure 8A:
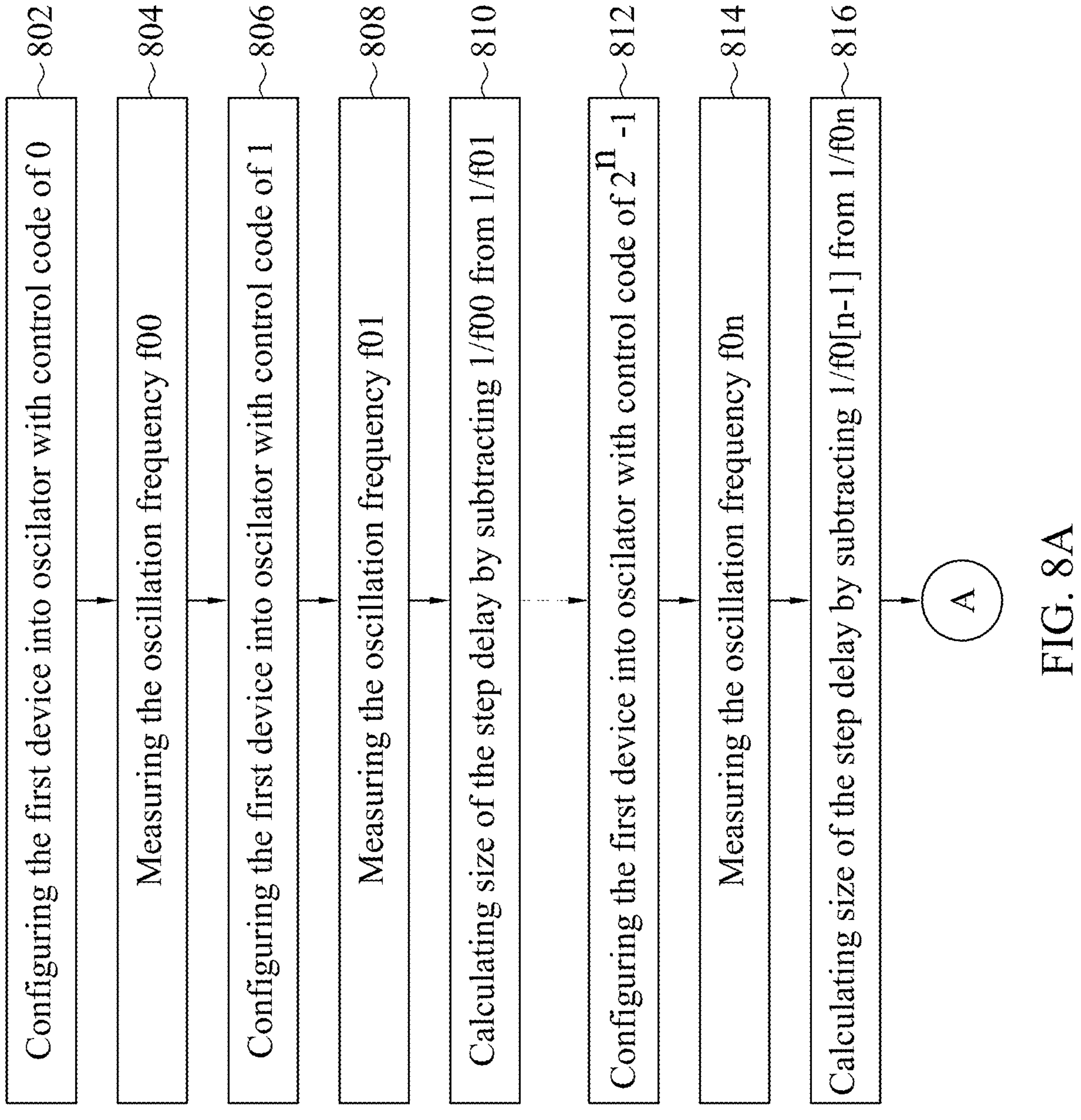
FIG. 8A to FIG. 8C illustrate a flow chart including operations for a measurement method, in accordance with some embodiments of the present disclosure.
Figure 8B:
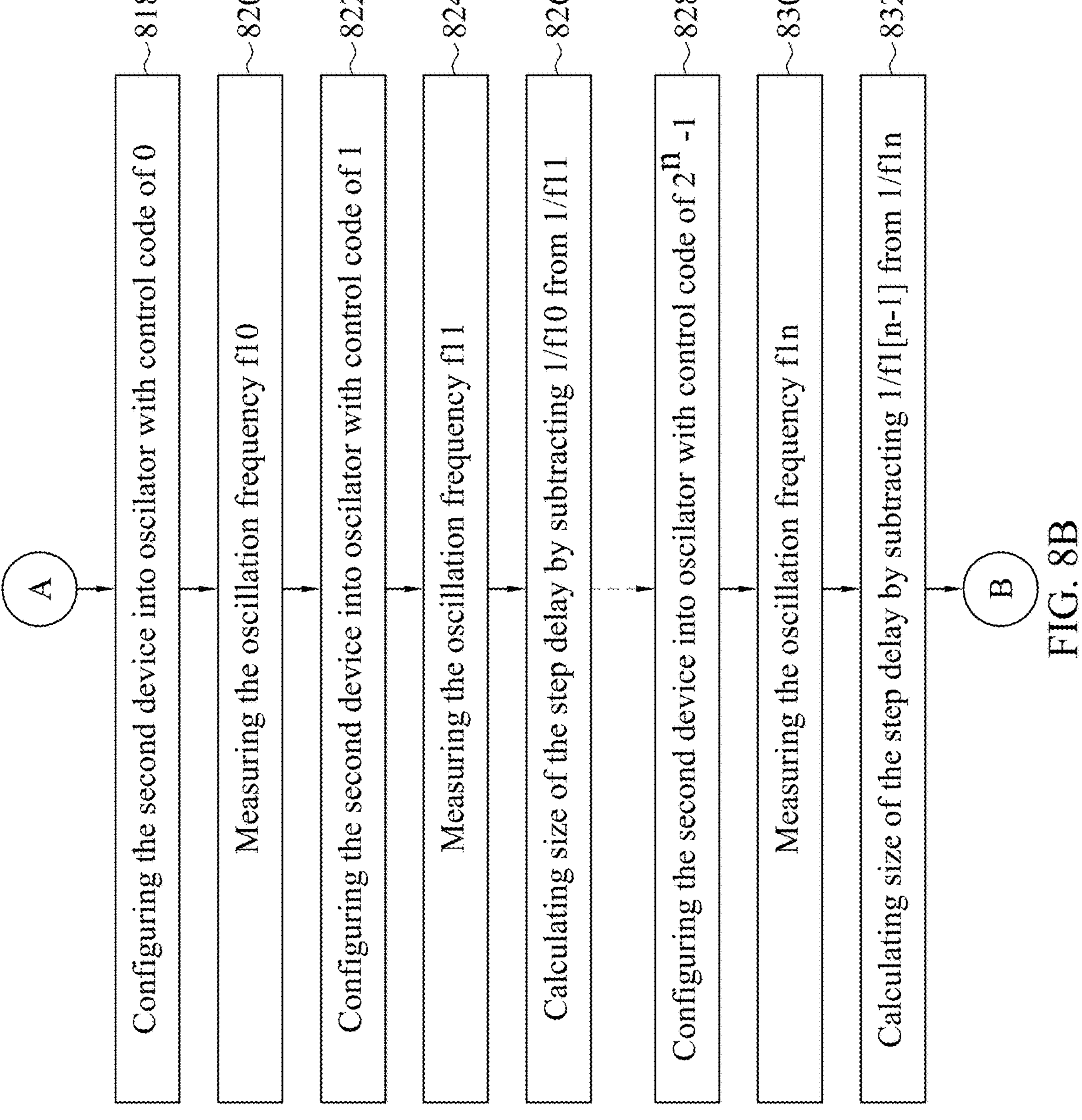
Figure 8C:
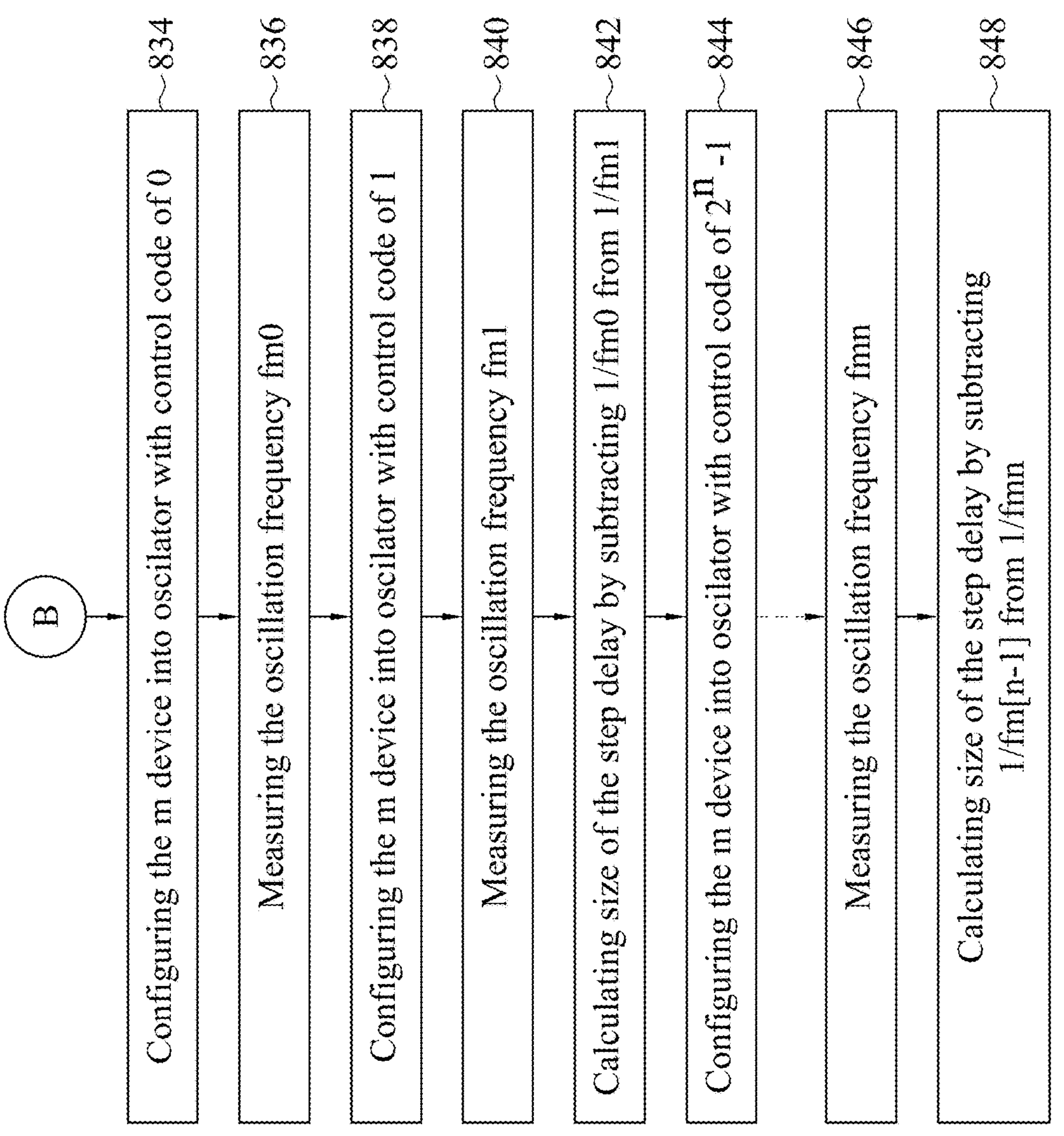

FIG. 8A to FIG. 8C illustrate a flow chart including operations for a measurement method 800 to determine the step delay, in accordance with some embodiments of the present disclosure. In some embodiments, the delay measurement system can include m DCDL units/components/devices associated with n bits. The measurement method 800 can be applied to evaluate different sizes of the step delays by configuring the DCDL units/components/devices as oscillators and calculating the frequency accordingly.

In the operation 802, the first device is configured into oscillator with control code of 0 (bit). In the operation 804, the oscillation frequency f00 is measured. In the operation 806, the first device is configured into oscillator with control code of 1. In the operation 808, the oscillation frequency f01 is measured. In the operation 810, the size of the step delay is calculated by subtracting 1/f00 from 1/f01 (i.e., 1/f01−1/f00). The calculated size of the step delay can be regarded as the step delay for the delay measurement system.

In the operation 812, the first device is configured into oscillator with control code of $2^n-1$. In the operation 814, the oscillation frequency fon is measured. In the operation 816, the size of the step delay by subtracting 1/f0[n−1] from 1/f0*n* (i.e., 1/f0*n*−1/f0[n−1]) is calculated to obtain another step delay. After the operation 810, configuring the first device into oscillator with control code of 2, measuring the oscillation frequency f02, calculating size of the step delay by subtracting 1/f01 from 1/f02, . . . , configuring the first device into oscillator with control code of $2^n-2$, measuring the oscillation frequency f0[n−1], and calculating size of the step delay by subtracting 1/f0[n−2] from 1/f0[n−1] may be performed in some embodiments.

In the operation 818, the second device is configured into oscillator with control code of 0. In the operation 820, the oscillation frequency f10 is measured. In the operation 822, the second device is configured into oscillator with control code of 1. In the operation 824, the oscillation frequency f11 is measured. In the operation 826, the size of the step delay by subtracting 1/f10 from 1/f11 (i.e., 1/f11−1/f10) is calculated to obtain another step delay.

In the operation 828, the second device is configured into oscillator with control code of $2^n-1$. In the operation 830, the oscillation frequency fln is measured. In the operation 832, the size of the step delay by subtracting 1/f1[n−1] from 1/f1*n* (i.e., 1/f1*n*−1/f1[n−1]) is calculated to obtain another step delay.

After the operation 826, configuring the first device into oscillator with control code of 2, measuring the oscillation frequency f12, calculating size of the step delay by subtracting 1/f11 from 1/f12, . . . , configuring the first device into oscillator with control code of $2^n-2$, measuring the oscillation frequency f1[n−1], and calculating size of the step delay by subtracting 1/f1[n−2] from 1/f1[n−1] may be performed in some embodiments.

In the operation 834, the m device is configured into oscillator with control code of 0. In the operation 836, the oscillation frequency fm0 is measured. In the operation 838, the m device is configured into oscillator with control code of 1. In the operation 840, the oscillation frequency fm1 is measured. In the operation 842, the size of the step delay by subtracting 1/fm0 from 1/fm1 (i.e., 1/fm1−1/fm0) is calculated to obtain another step delay.

In the operation 844, the m device is configured into oscillator with control code of $2^n-1$. In the operation 846, the oscillation frequency fmn is measured. In the operation 848, the size of the step delay by subtracting 1/fm[n−1] from 1/fmn (i.e., 1/fmn−1/fm[n−1]) is calculated to obtain another step delay.

After the operation 842, configuring the first device into oscillator with control code of 2, measuring the oscillation frequency fm2, calculating size of the step delay by subtracting 1/fm1 from 1/fm2, . . . , configuring the first device into oscillator with control code of $2^n-2$, measuring the oscillation frequency fm[n−1], and calculating size of the step delay by subtracting 1/fm[n−2] from 1/fm[n−1] may be performed in some embodiments.

Some embodiments of the present disclosure provide a delay measurement system. The delay measurement system includes a delay control device and a comparator. The delay control device is configured to generate a second signal in response to a first signal, wherein a rising edge of the second signal delays a first delay time with respect to a rising edge of the first signal, and the first delay time is controlled in response to an output signal of a comparator. The comparator is configured to compare the first delay time with a second delay time and output the output signal, wherein a rising edge of a third signal delays the second delay time with respect to the rising edge of the first signal, and the third signal is generated by a device under test (DUT) in response to the first signal.

Some embodiments of the present disclosure provide a delay measurement system. The delay measurement system includes a controller, a delay control device and a comparator. The controller is configured to determine a first set of step delays and a second set of step delays, wherein an average of the second step delay is smaller than an average of the first step delay. The delay control device is configured to generate a second signal in response to a first signal, wherein the second signal delays a first delay time with respect to the first signal. The comparator is configured to compare the first delay time with a second delay time, wherein a third signal delays the second delay time with respect to the first signal, and the third signal is generated by a DUT in response to the first signal. The delay control device is configured to perform at least one first tune on the first delay time based on the first set of step delays to approximate the first delay time, and perform at least one second tune on the first delay time based on the second set of step delays to approximate the first delay time.

Some embodiments of the present disclosure provide a measurement method. The measurement method includes determining a first set of step delays and a second set of step delays, wherein an average of the second step delay is smaller than an average of the first step delay; generating a second signal by a delay control device in response to a first signal, wherein the second signal delays a first delay time with respect to the first signal; generating a third signal by a device under test in response to the first signal, wherein the third signal delays a second delay time with respect to the first signal; when the first delay time is not smaller than the second delay time, decreasing the first delay time based on the first set of step delays until the first delay time is smaller than the second delay time; when the first delay time is not greater than the second delay time, increasing the first delay time based on the second set of step delays until the first delay time is greater than the second delay time; and saving the first delay time.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A delay measurement system, comprising:
- a delay control device, configured to generate a second signal in response to a first signal, wherein a rising edge of the second signal delays a first delay time with respect to a rising edge of the first signal, and the first delay time is controlled in response to a first output signal of a comparator; and
- a first delay controlled delay line (DCDL) device, configured to generate a fourth signal in response to the first signal, wherein the fourth signal delays a first offset time with respect to the first signal when a second output signal of the comparator is risen, a third signal is generated by a device under test (DUT) external to the first DCDL device in response to the fourth signal, and the first offset time is configured to align the rising edges of the second signal and the third signal; wherein
- the comparator is configured to compare the first delay time with a second delay time and output the output signal, wherein a rising edge of the third signal delays the second delay time with respect to the rising edge of the first signal, the second output signal of the comparator is risen when the second delay time is smaller than the first delay time.

2. The delay measurement system of claim 1, wherein the delay control device tunes the first delay time when the first delay time is not equal to the second delay time.

3. The delay measurement system of claim 1, wherein the delay control device comprises:
- a second DCDL device, configured to tune the first delay time by a first step delay; and
- a third DCDL device, configured to tune the first delay time by a second step delay, wherein the second step delay is smaller than the first step delay.

4. The delay measurement system of claim 3, wherein one of the second DCDL device and the third DCDL device decreases the first delay time, and the other of the second DCDL device and the third DCDL device increases the first delay time.

5. The delay measurement system of claim 4, wherein the comparator comprises:
- a first D flip-flop configured to receive the third signal as a first data and receive the second signal as a first clock;
- a second D flip-flop configured to receive the second signal as a second data and receive the third signal as a second clock; and
- a multiplexer configured to output of an output of the first D flip-flop or an output of the second D flip-flop based on whether the second DCDL device or the third DCDL device is enabled.

6. The delay measurement system of claim 4, further comprising:

a first counter coupled to the second DCDL device, configured to downcount to decrement the first delay time; and a second counter coupled to the third DCDL device, configured to upcount to increment the first delay time.

7. The delay measurement system of claim 1, wherein the first offset time equals to a second offset time, and the second offset time occurs at the delay control device when the first delay time is set to zero.

8. The delay measurement system of claim 1, wherein:

the delay measurement system is configured to generate a first phase signal and a second phase signal in response to the first signal; and the delay measurement system is configured to generate the second signal in response to the first phase signal, and the third signal is generated by the DUT in response to the first phase signal and the second phase signal.

9. The delay measurement system of claim 8, wherein:

the delay measurement system is configured to receive a phase control signal;

the delay measurement system is configured to generate the first phase signal in response to a first output of the delay measurement system and the first signal; and the delay measurement system is configured to generate the second phase signal in response to a second output of the delay measurement system.

10. The delay measurement system of claim 9, wherein one of the first phase signal and the second phase signal works as a data signal, and the other one of the first phase signal and the second phase signal works as a clock signal.

11. A delay measurement system, comprising:

a controller, configured to determine a first set of step delays and a second set of step delays, wherein an average of the second step delay is smaller than an average of the first step delay;

a delay control device, configured to generate a second signal in response to a first signal, wherein the second signal delays a first delay time with respect to the first signal;

a first delay controlled delay line (DCDL) device, configured to generate a fourth signal in response to the first signal, wherein the fourth signal delays a first offset time with respect to the first signal when a first output signal of the comparator is risen, a third signal is generated by a device under test (DUT) external to the first DCDL device in response to the fourth signal, and the first offset time is configured to align the rising edges of the second signal and the third signal; and a comparator, configured to compare the first delay time with a second delay time, wherein the third signal delays the second delay time with respect to the first signal, wherein:

the delay control device is configured to perform at least one first tune on the first delay time based on the first set of step delays to approximate the first delay time, and perform at least one second tune on the first delay time based on the second set of step delays to approximate the first delay time, the first output signal of the comparator is risen when the second delay time is smaller than the first delay time.

12. The delay measurement system of claim 11, wherein a first phase signal and a second phase signal are generated in response to the first signal and a phase control signal.

13. The delay measurement system of claim 12, wherein:

the DUT is configured to generate the third signal in response to the first phase signal and the second phase signal; and the delay control device is configured to generate the second signal in response to the first phase signal.

14. The delay measurement system of claim 13, wherein phase difference between the first phase signal and the second signal is increased until the second delay time is measurable.

15. The delay measurement system of claim 11, wherein the at least one first tune decreases the first delay time based on the first set of step delays until the first delay time is smaller than the second delay time.

16. The delay measurement system of claim 15, wherein the at least one second tune increases the first delay time based on the second set of step delays until the first delay time is greater than the second delay time.

17. A measurement method, comprising:

determining a first set of step delays and a second set of step delays, wherein an average of the second step delay is smaller than an average of the first step delay;

generating a second signal by a delay control device in response to a first signal, wherein the second signal delays a first delay time with respect to the first signal;

generating a third signal by a device under test (DUT) external to a first delay controlled delay line (DCDL) device in response to a fourth signal generated by the first DCDL device, wherein the fourth signal is generated when a first output signal of a comparator is risen, the third signal delays a second delay time with respect to the first signal, and the fourth signal delays a first offset time with respect to the first signal;

when the first delay time is not smaller than the second delay time, decreasing the first delay time based on the first set of step delays until the first delay time is smaller than the second delay time;

when the first delay time is not greater than the second delay time, increasing the first delay time based on the second set of step delays until the first delay time is greater than the second delay time; and saving the first delay time.

18. The method of claim 17, wherein the first offset time equals to a second offset time, and the second offset time occurs at the delay control device when the first delay time is set to zero.

19. The method of claim 17, further comprising:

generating a first phase signal and a second phase signal in response to the first signal and a phase control signal;

generating the second signal by the delay control device in response to the first phase signal; and generating the third signal by the DUT in response to the first phase signal and the second phase signal.

20. The method of claim 19, further comprising:

increasing a phase difference between the first phase signal and the second signal until the second delay time is measurable.

* * * * *